United States Patent
Wu et al.

(10) Patent No.: US 8,674,396 B1
(45) Date of Patent: Mar. 18, 2014

(54) ELECTRODE PAD STRUCTURE OF LIGHT EMITTING DEVICE

(71) Applicants: Chih-Ling Wu, Tainan (TW); Jing-En Huang, Tainan (TW); Yi-Ru Huang, Tainan (TW); Yu-Yun Lo, Tainan (TW)

(72) Inventors: Chih-Ling Wu, Tainan (TW); Jing-En Huang, Tainan (TW); Yi-Ru Huang, Tainan (TW); Yu-Yun Lo, Tainan (TW)

(73) Assignee: Genesis Photonics Inc., Tainan (TW)

( * ) Notice: Subject to any disclaimer, the term of this patent is extended or adjusted under 35 U.S.C. 154(b) by 0 days.

(21) Appl. No.: 13/831,864

(22) Filed: Mar. 15, 2013

(30) Foreign Application Priority Data

Dec. 27, 2012 (TW) .............................. 101150373 A

(51) Int. Cl.
*H01L 33/00* (2010.01)

(52) U.S. Cl.
USPC ..... 257/99; 257/98; 257/E33.012; 257/E33.062; 257/E31.124

(58) Field of Classification Search
USPC ........ 257/98, 99, E33.012, E33.062, E31.124
See application file for complete search history.

(56) References Cited

U.S. PATENT DOCUMENTS

| 6,504,252 | B2 * | 1/2003 | Matsunaga | 257/758 |
|---|---|---|---|---|
| 2005/0053110 | A1 * | 3/2005 | Kaneko | 372/50 |
| 2006/0001035 | A1 * | 1/2006 | Suehiro et al. | 257/91 |
| 2006/0113548 | A1 * | 6/2006 | Chen et al. | 257/79 |
| 2007/0287236 | A1 * | 12/2007 | Kim | 438/158 |
| 2010/0230699 | A1 * | 9/2010 | Song | 257/98 |
| 2011/0024781 | A1 * | 2/2011 | Fujimoto et al. | 257/98 |
| 2011/0049572 | A1 * | 3/2011 | Jeon et al. | 257/201 |
| 2011/0215350 | A1 * | 9/2011 | Song et al. | 257/93 |
| 2011/0215358 | A1 * | 9/2011 | Hwang et al. | 257/98 |

* cited by examiner

*Primary Examiner* — Bilkis Jahan
(74) *Attorney, Agent, or Firm* — Jianq Chyun IP Office

(57) ABSTRACT

An electrode pad structure of a light emitting device includes an insulation layer, a first type electrode pad and at least one second type electrode pad. The light emitting device has a centerline and the light emitting device is divided into two equal blocks via the centerline. The first type electrode pad is disposed on the insulation layer and symmetrical to the centerline. The second type electrode pad is disposed on the insulation layer and symmetrical to the centerline. The first type electrode pad is coplanar with the second type electrode pad, and a portion of the insulation layer is exposed between the first type electrode pad and the second type electrode pad.

12 Claims, 3 Drawing Sheets

ELECTRODE PAD STRUCTURE OF LIGHT EMITTING DEVICE

CROSS-REFERENCE TO RELATED APPLICATION

This application claims the priority benefit of Taiwan application serial no. 101150373, filed on Dec. 27, 2012. The entirety of the above-mentioned patent application is hereby incorporated by reference herein and made a part of this specification.

BACKGROUND OF THE INVENTION

1. Field of the Invention

The present invention generally relates to an electrode pad structure, and in particular, to an electrode pad structure of a light emitting device.

2. Description of Related Art

A light emitting diode (LED) structure has advantages of low power consumption, environment friendly, long service life and fast reaction speed, so the LED structure has been widely applied to the lighting field and the display field.

Generally, an LED has a P-type electrode pad and an N-type electrode pad. When the LED is to be assembled to a lamp panel to form a light source module, because the structure of the P-type electrode pad is different from that of the N-type electrode pad, the LED has to be assembled to the lamp panel according to the directional assembly. As a result, as far as an assembler is concerned, an assembly confirmation process is required. If the assembler does not pay attention to the erroneous assembly direction of the electrode pad, and still makes the electrode pad in contact with the lamp panel to complete assembly, the short is generated so as to influence the service life of the LED.

SUMMARY OF THE INVENTION

Accordingly, the present invention is directed to an electrode pad structure of a light emitting device, a first type electrode pad and a second type electrode pad of which are disposed in a manner with a fool-proof function, and which may prevent the electrode pad structure from being provided with the directional assembly, and may improve the assembly efficiency of the light emitting device.

The present invention proposes an electrode pad structure of a light emitting device, including an insulation layer, a first type electrode pad and at least one second type electrode pad. The light emitting device has a centerline, and the light emitting device is divided into two equal blocks via the centerline. The first type electrode pad is disposed on the insulation layer and symmetrical to the centerline. The second type electrode pad is disposed on the insulation layer and symmetrical to the centerline, where the first type electrode pad is coplanar with the second type electrode pad, and a portion of the insulation layer is exposed between the first type electrode pad and the second type electrode pad.

In an embodiment of the present invention, the foregoing light emitting device is a rectangular light emitting device, and the centerline includes a centerline in a longitudinal axis direction and a centerline in a transversal axis direction of the light emitting device.

In an embodiment of the present invention, the foregoing light emitting device is a rectangular light emitting device, and the centerline is a diagonal line of the light emitting device.

In an embodiment of the present invention, the foregoing at least one second type electrode pad is two second type electrode pads, and the second type electrode pads are respectively arranged at two sides of the first type electrode pad.

In an embodiment of the present invention, at least one edge of each of the foregoing second type electrode pads is aligned with the boundary of the insulation layer.

In an embodiment of the present invention, the foregoing second type electrode pad encloses the first type electrode pad.

In an embodiment of the present invention, the foregoing second type electrode pad is in the shape of a frame, and the second type electrode pad encircles the first type electrode pad.

In an embodiment of the present invention, the foregoing at least one second type electrode pad is a plurality of second type electrode pads, and the second type electrode pads are separately arranged around the first type electrode pad.

In an embodiment of the present invention, the shape of the foregoing second type electrode pad includes rectangle, round or ellipse.

In an embodiment of the present invention, at least one edge of each of the foregoing second type electrode pads is aligned with the boundary of the insulation layer.

In an embodiment of the present invention, each of the foregoing second type electrode pads is apart from the boundary of the insulation layer at an interval, and the boundary of the first type electrode pad is aligned with the boundary of the insulation layer.

In an embodiment of the present invention, two edges of each of the foregoing second type electrode pads are aligned with the boundary of the insulation layer.

Based on the above description, the electrode pad structure of the light emitting device of the present invention is designed with the second type electrode pad and the first type electrode pad symmetrical to the centerline of the light emitting device, and the first type electrode pad is coplanar with the second type electrode pad, so there is no directional assembly for the electrode pad structure of the present invention, and the assembly efficiency of the light emitting device may be improved.

In order to make the aforementioned and other objectives and advantages of the present invention comprehensible, embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1A:
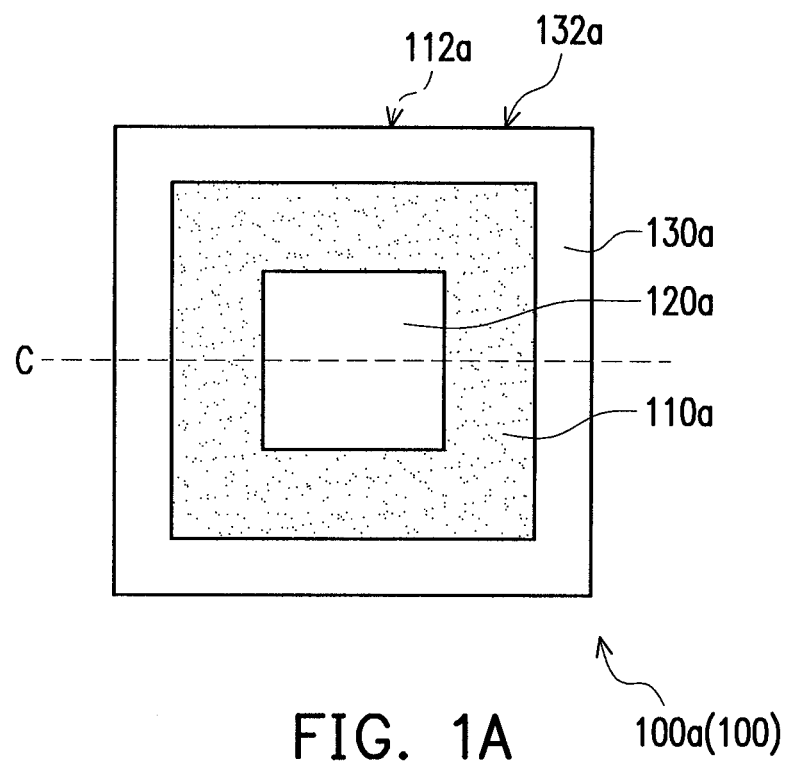
FIG. 1A is a schematic top view of an electrode pad structure of a light emitting device of an embodiment of the present invention.

FIG. 1A is a schematic top view of an electrode pad structure of a light emitting device of an embodiment of the present invention. Referring to FIG. 1A, in this embodiment, an electrode pad structure 100a of a light emitting device 100 includes an insulation layer 110a, a first type electrode pad 120a and at least one second type electrode pad 130a (only one is schematically shown in FIG. 1A). The light emitting device 100 has a centerline C, and the light emitting device 100 is divided into two equal blocks via the centerline C. The first type electrode pad 120a is disposed on the insulation layer 110a and symmetrical to the centerline C. The second type electrode pad 130a is disposed on the insulation layer 110a and symmetrical to the centerline C. Particularly, the first type electrode pad 120a is coplanar with the second type electrode pad 130a, and a portion of the insulation layer 110a is exposed between the first type electrode pad 120a and the second type electrode pad 130a.

More specifically, the light emitting device 100 of this embodiment is for example an LED chip in the flip chip type, and one of the first type electrode pad 120a and the second type electrode pad 130a is a P-type electrode pad, the other one is an N-type electrode pad, which is not limited herein, and the N-type electrode pad and the P-type electrode pad are respectively electrically connected to an N-type semiconductor layer and a P-type semiconductor layer of the light emitting device 100. In this embodiment, the second type electrode pad 130a is for example in the shape of a frame, and the second type electrode pad 130a encircles the first type electrode pad 120a. As shown in FIG. 1A, the boundary 132a of the second type electrode pad 130a is substantially aligned with the boundary 112a of the insulation layer 110a.

The second type electrode pad 130a of the electrode pad structure 100a of the light emitting device 100 of this embodiment completely encircles the first type electrode pad 120a, and both the first type electrode pad 120a and the second type electrode pad 130a are designed in a structure symmetrical to the centerline C of the light emitting device 100, so there is no directional assembly for the first type electrode pad 120a and the second type electrode pad 130a. Therefore, the assembly efficiency of the light emitting device 100 may be improved.

It should be noted herein that, the following embodiment continues to use device mark numbers and a portion of the content of the aforementioned embodiment, where the same mark number is adopted to represent the same or similar device, and the illustration for the same technical content is omitted. Reference may be made to the aforementioned embodiment for the illustration for the omitted portion, which is not repetitively described again in the following embodiment.

Figure 1B:
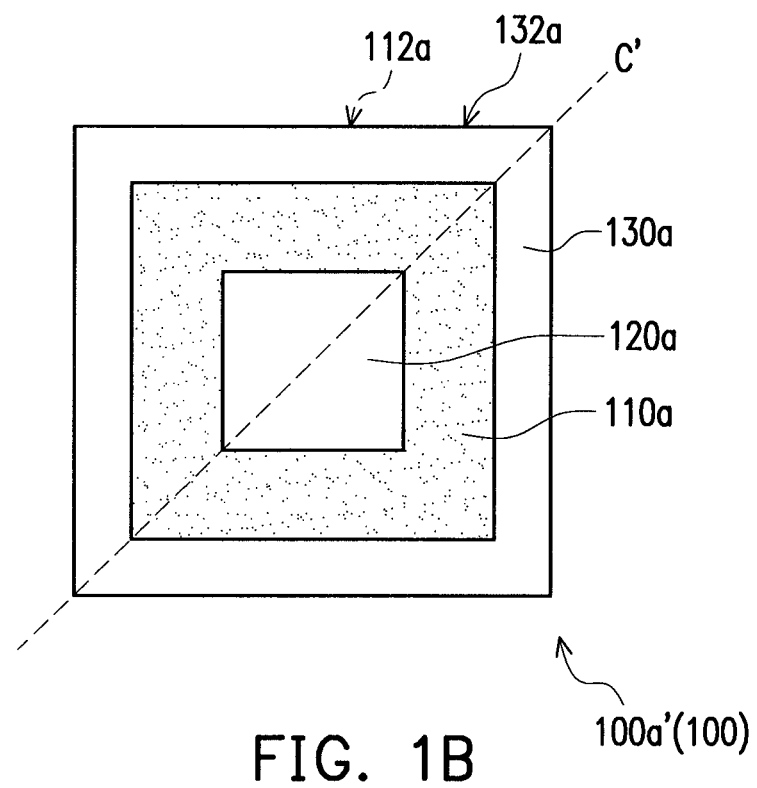
FIG. 1B is a schematic top view of an electrode pad structure of a light emitting device of another embodiment of the present invention.

FIG. 1B is a schematic top view of an electrode pad structure of a light emitting device of another embodiment of the present invention. Referring to FIG. 1B, an electrode pad structure 100a' of the light emitting device 100 of this embodiment is similar to the electrode pad structure 100a of the light emitting device 100 in FIG. 1A, and the difference lies in that: a centerline C' of the electrode pad structure 100a' of the light emitting device 100 of this embodiment is a diagonal line of the light emitting device 100.

Figure 2:
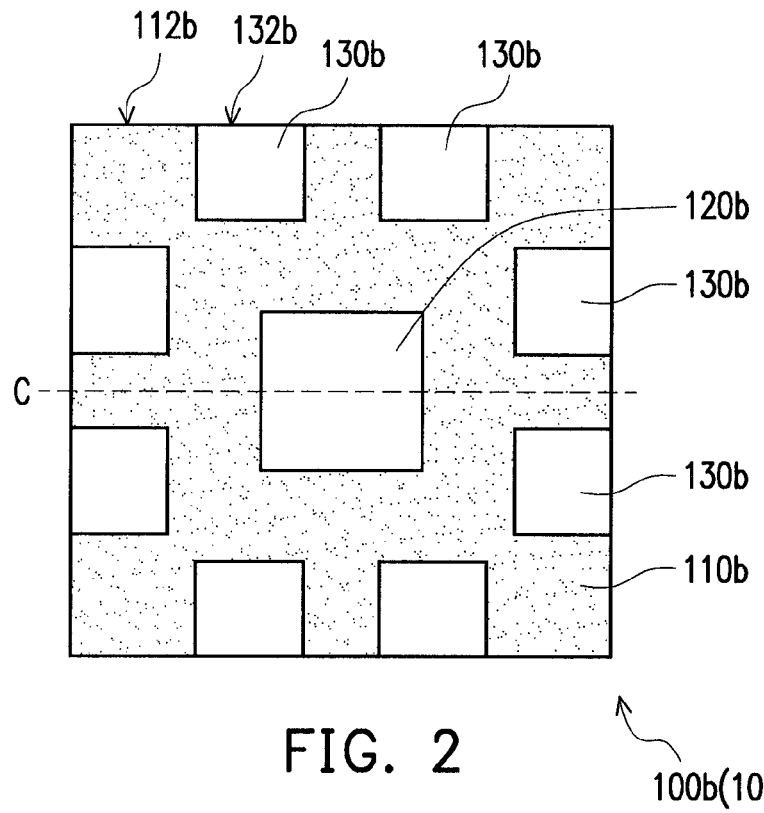
FIG. 2 is a schematic top view of an electrode pad structure of a light emitting device of another embodiment of the present invention.

FIG. 2 is a schematic top view of an electrode pad structure of a light emitting device of another embodiment of the present invention. Referring to FIG. 2, an electrode pad structure 100b of the light emitting device 100 of this embodiment is similar to the electrode pad structure 100a of the light emitting device 100 in FIG. 1A, and the difference lies in that: the electrode pad structure 100b of the light emitting device 100 of this embodiment has a plurality of second type electrode pads 130b, and the second type electrode pads 130b are separately arranged around a first type electrode pad 120b. An insulation layer 110b is located between the first type electrode pad 120b and the second type electrode pads 130b and between the plurality of second type electrode pads 130b. More specifically, as shown in FIG. 2, the second type electrode pad 130b is for example in the shape of a rectangle, and an edge 132b of each second type electrode pad 130b is substantially aligned with the boundary 112b of the insulation layer 110b.

The second type electrode pads 130b of the electrode pad structure 100b of the light emitting device 100 of this embodiment are arranged around the first type electrode pad 120b separately and symmetrical to the centerline C, so there is no directional assembly for the first type electrode pad 120b and the second type electrode pad 130b. Therefore, the assembly efficiency of the light emitting device 100 may be improved.

Figure 3:
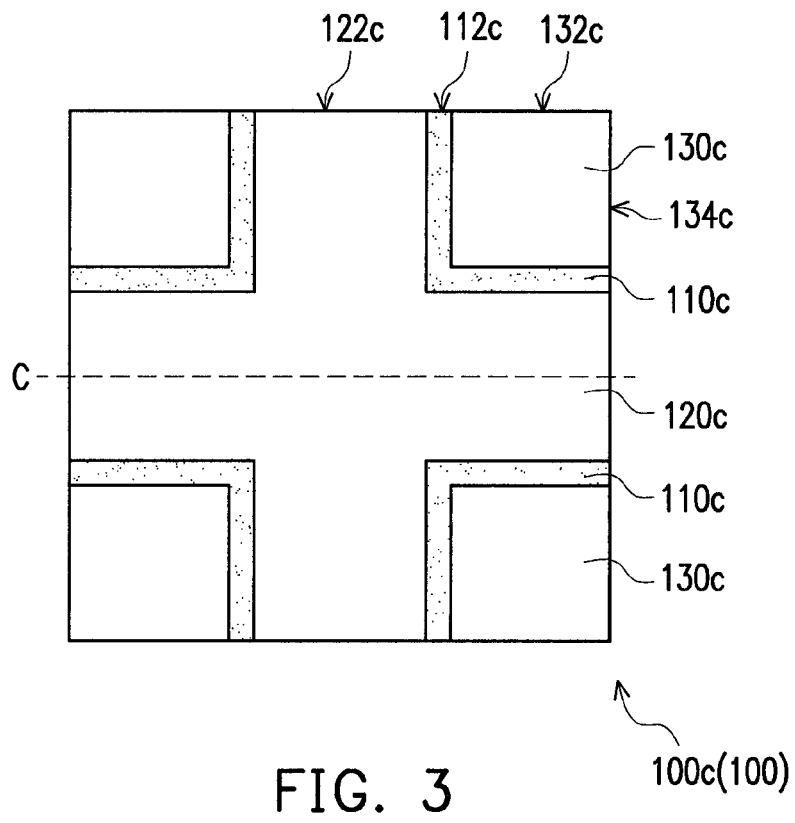
FIG. 3 is a schematic top view of an electrode pad structure of a light emitting device of still another embodiment of the present invention.
Figure 4:
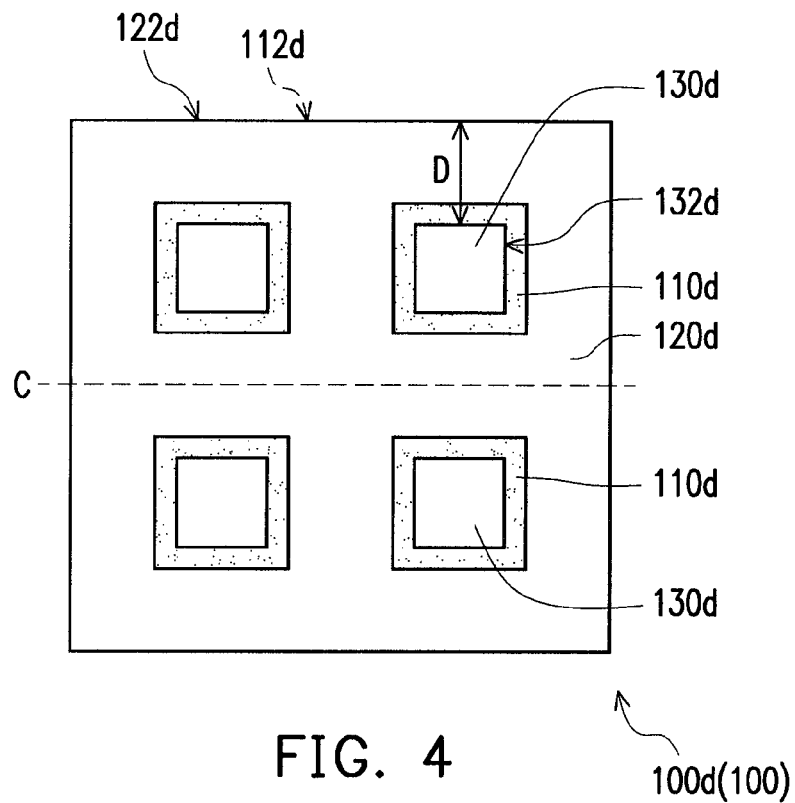
FIG. 4 is a schematic top view of an electrode pad structure of a light emitting device of yet another embodiment of the present invention.

It is worth being noted that, the present invention does not limit the location of the second type electrode pad 130b. The location of the second type electrode pad 130b mentioned here is specifically set along the boundary 112b of the insulation layer 110b (namely, an edge 132b of each second type electrode pad 130b is substantially aligned with the boundary 112b of the insulation layer 110b), but in other embodiments, referring to FIG. 3, two edges 132c and 134c of each second type electrode pad 130c of an electrode pad structure 100c of a light emitting device 100 are substantially aligned with the boundary 112c of an insulation layer 110c, and the boundary 122c of a first type electrode pad 120c is also substantially aligned with the boundary 112c of the insulation layer 110c; or, referring to FIG. 4, the boundary 132d of each second type electrode pad 130d of an electrode pad structure 100d of a light emitting device 100 is apart from the boundary 112d of an insulation layer 110d at an interval D, and the boundary 122d of a first type electrode pad 120d is substantially aligned with the boundary 112d of the insulation layer 110d. Therefore, the arrangement manner of the second electrode pad 130b shown in FIG. 2 is only exemplified, and does not intend to limit the present invention.

Figure 5:
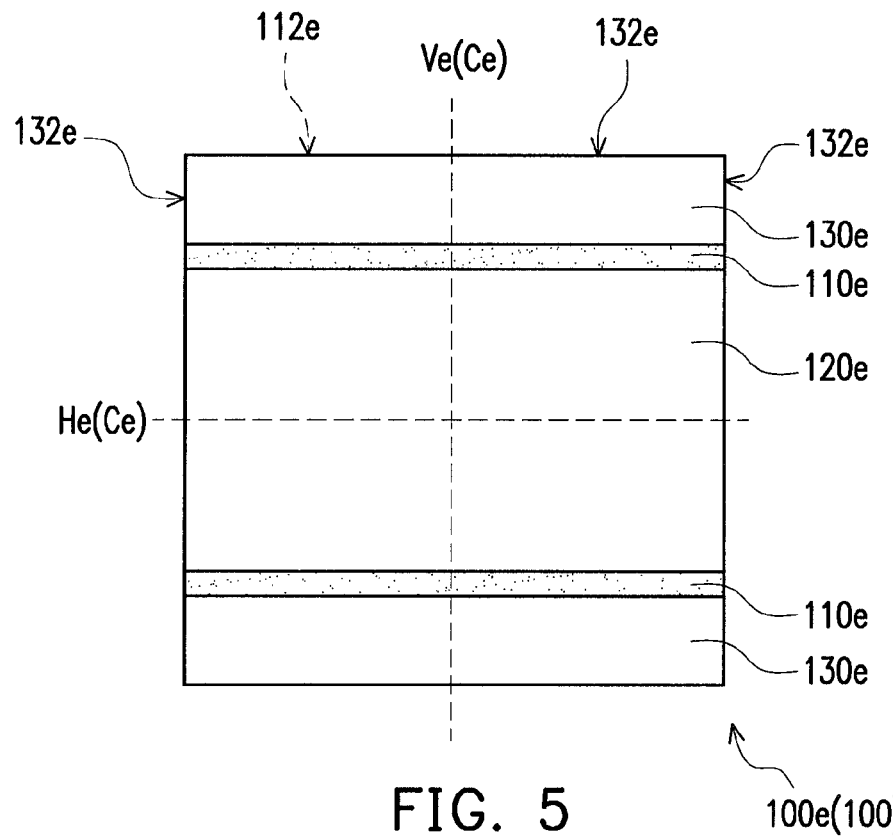
FIG. 5 is a schematic top view of an electrode pad structure of a light emitting device of further another embodiment of the present invention.

FIG. 5 is a schematic top view of an electrode pad structure of a light emitting device of further another embodiment of the present invention. Referring to FIG. 5, the light emitting device 100 of this embodiment is a rectangular light emitting device, where a centerline Ce includes a centerline Ve in a longitudinal axis direction and a centerline He in a transversal axis direction of the light emitting device 100. A second type electrode pad 130e of an electrode pad structure 100e of the light emitting device 100 encloses a first type electrode pad 120e.

Specifically, the number of second type electrode pads 130e of this embodiment is two, where the second type electrode pads 130e are respectively arranged at two sides of the first type electrode pad 120e. At least one edge 132e of each second type electrode pad 130e is aligned with the boundary 112e of an insulation layer 110e. More specifically, in order to enable the current to be distributed more uniformly, three edges 132e of each second type electrode pad 130e is aligned with the boundary 112e of the insulation layer 110e.

The second type electrode pads 130e of the electrode pad structure 100e of the light emitting device 100 of this embodiment are symmetrical to the centerline Ce of the light emitting device 100 and arranged at two sides of the first type electrode pad 120e, where the light emitting device 100 is a rectangular light emitting device, so there is no directional assembly for the first type electrode pad 120e and the second type electrode pad 130e. Therefore, the assembly efficiency of the light emitting device 100 may be improved.

Additionally, the present invention does not limit the shapes of the second type electrode pads 130b, 130c, 130d, and 130e. The shapes of the second type electrode pads 130b, 130c, 130d, and 130e mentioned here are specifically rectangles, but in other embodiments not shown, the shape of the second electrode pad may also be round, ellipse or other appropriate polygons. It should be noted that, the present invention does not limit the appearance and profile of the light emitting device 100. The rectangular profiles shown in FIG. 1A to FIG. 5 are schematic, namely, the light emitting device is rectangular, but as long as there is no directionally for the shape of the second type electrode pad and the shape conforms to the design that the second type electrode pads are symmetrical to the centerline and encloses the first type electrode pad symmetrical to the centerline, the shape still belongs to the technical solution which the present invention may adopt without departing from the scope which the present invention intends to protect.

To sum up, the electrode pad structure of the light emitting device of the present invention is designed with the second type electrode pad and the first type electrode pad symmetrical to the centerline of the light emitting device, and the first type electrode pad is coplanar with the second type electrode pad, so there is no directional assembly for the electrode pad structure of the present invention, and the assembly efficiency of the light emitting device may be improved.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. An electrode pad structure of a light emitting device, wherein the light emitting device comprises a centerline, the light emitting device is divided into two equal blocks via the centerline, and the electrode pad structure of the light emitting device comprises:
    an insulation layer;
    a first type electrode pad, disposed on the insulation layer and symmetrical to the centerline; and
    at least one second type electrode pad, disposed on the insulation layer and symmetrical to the centerline, wherein the first type electrode pad is coplanar with the second type electrode pad, and a portion of the insulation layer is exposed between the first type electrode pad and the second type electrode pad.

2. The electrode pad structure of the light emitting device as recited in claim 1, wherein the light emitting device is a rectangular light emitting device, and the centerline comprises a centerline in a longitudinal axis direction and a centerline in a transversal axis direction of the light emitting device.

3. The electrode pad structure of the light emitting device as recited in claim 1, wherein the light emitting device is a rectangular light emitting device, and the centerline is a diagonal line of the light emitting device.

4. The electrode pad structure of the light emitting device as recited in claim 2, wherein the at least one second type electrode pad is two second type electrode pads, and the second type electrode pads are respectively arranged at two sides of the first type electrode pad.

5. The electrode pad structure of the light emitting device as recited in claim 4, wherein at least one edge of each of the second type electrode pads is aligned with the boundary of the insulation layer.

6. The electrode pad structure of the light emitting device as recited in claim 1, wherein the second type electrode pad encloses the first type electrode pad.

7. The electrode pad structure of the light emitting device as recited in claim 6, wherein the second type electrode pad is in the shape of a frame, and the second type electrode pad encircles the first type electrode pad.

8. The electrode pad structure of the light emitting device as recited in claim 6, wherein the at least one second type electrode pad is a plurality of second type electrode pads, and the second type electrode pads are separately arranged around the first type electrode pad.

9. The electrode pad structure of the light emitting device as recited in claim 6, wherein the shape of the second type electrode pads comprises rectangle, round or ellipse.

10. The electrode pad structure of the light emitting device as recited in claim 6, wherein an edge of the second type electrode pad is aligned with the boundary of the insulation layer.

11. The electrode pad structure of the light emitting device as recited in claim 6, wherein the second type electrode pad is apart from the boundary of the insulation layer at an interval, and the boundary of the first type electrode pad is aligned with the boundary of the insulation layer.

12. The electrode pad structure of the light emitting device as recited in claim 6, wherein two edges of the second type electrode pad are aligned with the boundary of the insulation layer.

* * * * *